(12) United States Patent
Kamikawa et al.

(10) Patent No.: US 7,972,468 B2
(45) Date of Patent: Jul. 5, 2011

(54) SEMICONDUCTOR DEVICE FABRICATING SYSTEM

(75) Inventors: Yuji Kamikawa, Tosu (JP); Masahiro Noda, Tosu (JP)

(73) Assignee: Tokyo Electron Limited, Tokyo (JP)

( * ) Notice: Subject to any disclaimer, the term of this patent is extended or adjusted under 35 U.S.C. 154(b) by 993 days.

(21) Appl. No.: 11/889,615

(22) Filed: Aug. 15, 2007

(65) Prior Publication Data
US 2008/0041525 A1   Feb. 21, 2008

(30) Foreign Application Priority Data
Aug. 17, 2006 (JP) .................... 2006-222401

(51) Int. Cl.
*H01L 21/306* (2006.01)
*C23C 16/00* (2006.01)

(52) U.S. Cl. ............. 156/345.24; 156/345.32; 156/916; 118/713; 118/719; 414/935

(58) Field of Classification Search ............ 156/345.31, 156/345.24, 31, 32, 916; 118/713, 719; 414/935
See application file for complete search history.

(56) References Cited

U.S. PATENT DOCUMENTS

| | | | | |
|---|---|---|---|---|
| 5,443,642 A | * | 8/1995 | Bienduga | 118/688 |
| 5,695,207 A | * | 12/1997 | Mouterde et al. | 280/163 |
| 6,473,151 B1 | * | 10/2002 | Deguchi | 355/27 |
| 2004/0226510 A1 | * | 11/2004 | Hanson et al. | 118/719 |

FOREIGN PATENT DOCUMENTS
JP   2002-134588   5/2002

* cited by examiner

*Primary Examiner* — Karla Moore
*Assistant Examiner* — Nathan K Ford
(74) *Attorney, Agent, or Firm* — Smith, Gambrell & Russell, LLP (57) ABSTRACT

A semiconductor device fabricating system 1 includes a casing 10, processing units 12, 13 and 14, for carrying out semiconductor device fabricating processes, disposed inside the casing, and platforms 15, 16 and 17 set outside the casing. The platforms are foldable. Spaces required by the platforms can be reduced and the footprint of the semiconductor device fabricating system can be reduced by folding the platforms.

7 Claims, 7 Drawing Sheets

SEMICONDUCTOR DEVICE FABRICATING SYSTEM

CROSS REFERENCE TO RELATED APPLICATIONS

This application is based upon and claims the benefit of priority from the prior Japanese Patent Application No. 2006-222401 filed on Aug. 17, 2006, and the entire contents of which are incorporated herein by reference.

BACKGROUND OF THE INVENTION

1. Field of the Invention

The present invention relates to a semiconductor device fabricating system.

2. Description of the Related Art

A semiconductor device fabricating device such as disclosed in JP-A 2002-134588, which performs various processes including those for processing a wafer by cleaning, drying and etching, has been used for fabricating a semiconductor device. A conventional semiconductor device fabricating system includes a carrier handling unit for receiving and sending out a carrier containing plural wafers, a wafer carrying unit for carrying the wafers contained in the carrier, and a wafer processing unit for processing the wafers by various processes including cleaning process, drying process, and etching process. The carrier handling unit is disposed in one end area in a box-shaped casing, the wafer carrying unit is disposed behind the carrier handling unit in the casing, and the processing unit is disposed behind the wafer carrying unit in the casing. Stationary platforms are disposed beside the casing. The platforms are used for maintenance work for inspecting and cleaning the processing unit and changing parts of the processing unit and for inspecting the processing condition of the wafer processing unit.

Therefore, a space for installing the stationary platforms is needed in addition to a space for the semiconductor device fabricating system when the semiconductor device fabricating system is installed in a plant. Thus the platforms increase the footprint of the semiconductor device fabricating system. The platforms disposed beside the semiconductor device fabricating system are used mostly for maintenance work and inspection work and are rarely used while the semiconductor device fabricating system is in a normal operation for accomplishing those processes. That is to say, although the platforms are not used frequently, the platforms increase the footprint of the semiconductor device fabricating system. Thus, in some cases, the installation of the conventional semiconductor device fabricating system is subject to restrictions on layout.

SUMMARY OF THE INVENTION

A semiconductor device fabricating system in a first aspect of the present invention includes: a casing; a processing unit disposed in the casing to fabricate a semiconductor device; and a platform disposed outside the casing; wherein the platform is foldable.

In the semiconductor device fabricating system in the first aspect of the present invention, the platform may include: a top board unit capable of being substantially horizontally extended from the casing, the top board unit having an inner side extending near the casing, the inner side being connected to the casing so as to be turnable; a leg unit connected to an outer side of the top board unit apart from the casing so as to be turnable, the leg unit being capable of being extended vertically down from the substantially horizontally extended top board unit; and a handrail unit connected to the outer side of the top board unit apart from the casing so as to be turnable, the handrail unit being capable of rising up from the substantially horizontally extended top board unit, and the platform may be configured to be folded such that the top board unit, the leg unit and the handrail unit are superposed.

In the semiconductor device fabricating system in the first aspect of the present invention, the platform may include: a top board unit capable of being substantially horizontally extended from the casing, the top board unit having an inner side extending near the casing, the inner side being connected to the casing so as to be turnable; a handrail unit connected to an outer side of the top board unit apart from the casing so as to be turnable, the handrail unit being capable of rising up from the substantially horizontally extended top board unit; and a fall preventing wall set up on the outer side of the top board unit apart from the casing, the fall preventing wall being interlocked with the handrail unit so as to rise up together with the handrail unit.

In the semiconductor device fabricating system in the first aspect of the present invention, the casing may be dividable into divisions respectively for processing modules, and platforms combined respectively with the processing modules may be individually set outside the casing. In this semiconductor device fabricating system, the casing may be provided with a partition wall therein on the side of the platform with respect to the processing unit.

In the semiconductor device fabricating system in the first aspect of the present invention, the casing may be provided with a door, a storage space for storing the platform may be formed in the casing and is covered with the door, and the door may be capable of being opened and closed in either of a state where the platform is held in the storage space and a state where the platform is set outside the casing. In this semiconductor device fabricating system, the casing may be provided with a door sensor for sensing an open state and a close state of the door, and the processing unit may be configured to be set for an unoperatable mode when the sensor corresponding to the processing unit senses the open state of the door, and the processing unit is configured to be set for an operatable mode when the same sensor senses the closed state of the door.

In the semiconductor device fabricating system in the first aspect of the present invention, the casing may be provided with a door, a storage space covered with the door for storing the platform may be formed in the casing, and a space for piping or wiring connected to the processing unit may be formed under the storage space for storing the platform.

A semiconductor device fabricating system in a second aspect of the present invention includes: a casing; a processing unit disposed inside the casing to fabricate a semiconductor device; and a platform disposed outside the casing, wherein a storage space for storing the platform is formed in the casing.

In the semiconductor device fabricating system in the second aspect of the present invention, the platform may be foldable.

In the semiconductor device fabricating system in the second aspect of the present invention, the platform may include: a top board capable of being substantially horizontally extended from the casing, the top board unit having an inner side extending near the casing, the inner side being connected to the casing so as to be turnable; a leg unit connected to an outer side of the top board unit apart from the casing so as to be turnable, the leg unit being capable of being extended vertically down from the substantially horizontally extended top board unit; and a handrail unit connected to the outer side of the top board unit apart from the casing so as to be turnable, the handrail unit being capable of rising up from the substantially horizontally extended top board unit, and the platform may be configured to be folded such that the top board unit, the leg unit and the handrail unit are superposed.

In the semiconductor device fabricating system in the second aspect of the present invention, the platform may include: a top board unit capable of being substantially horizontally extended from the casing, the top board unit having an inner side extending near the casing, the inner side being connected to the casing so as to be turnable; a handrail unit connected to an outer side of the top board unit apart from the casing so as to be turnable, the handrail unit being capable of rising up from the substantially horizontally extended top board unit; and a fall preventing wall set up on the outer side of the top board unit apart from the casing, the fall preventing wall being interlocked with the handrail unit so as to rise up together with the handrail unit.

In the semiconductor device fabricating system in the second aspect of the present invention, the casing may be dividable into divisions respectively for processing modules, and platforms combined respectively with the processing modules may be individually set outside the casing. In this semiconductor device fabricating system, a space, for holding the processing modules, in the casing and the storage space, for storing the platform, in the casing may be separated from each other by a partition wall.

In the semiconductor device fabricating system in the second aspect of the present invention, the casing may be provided with a door, the storage space for storing the platform may be covered with the door, and the door may be capable of being opened and closed in either of a state where the platform is held in the storage space and a state where the platform is set outside the casing. In this semiconductor device fabricating system, the casing may be provided with a door sensor for sensing an open state and a close state of the door, and the processing unit is configured to be set for an unoperatable mode when the sensor corresponding to the processing unit senses the open state of the door, and the processing unit is configured to be set for an operatable mode when the same sensor senses the closed state of the door.

In the semiconductor device fabricating system in the second aspect of the present invention, the casing may be provided with a door, the storage space for storing the platform may be covered with the door, and a space for piping or wiring connected to the processing unit may be formed under the storage space for storing the platform.

BRIEF DESCRIPTION OF THE DRAWINGS

The above and other objects, features and advantages of the present invention will become more apparent from the following description taken in connection with the accompanying drawings, in which.

DESCRIPTION OF THE PREFERRED EMBODIMENTS

The present invention will be described with reference to the accompanying drawings in terms of a semiconductor device fabricating system serving as a substrate cleaning system.

Figure 1:
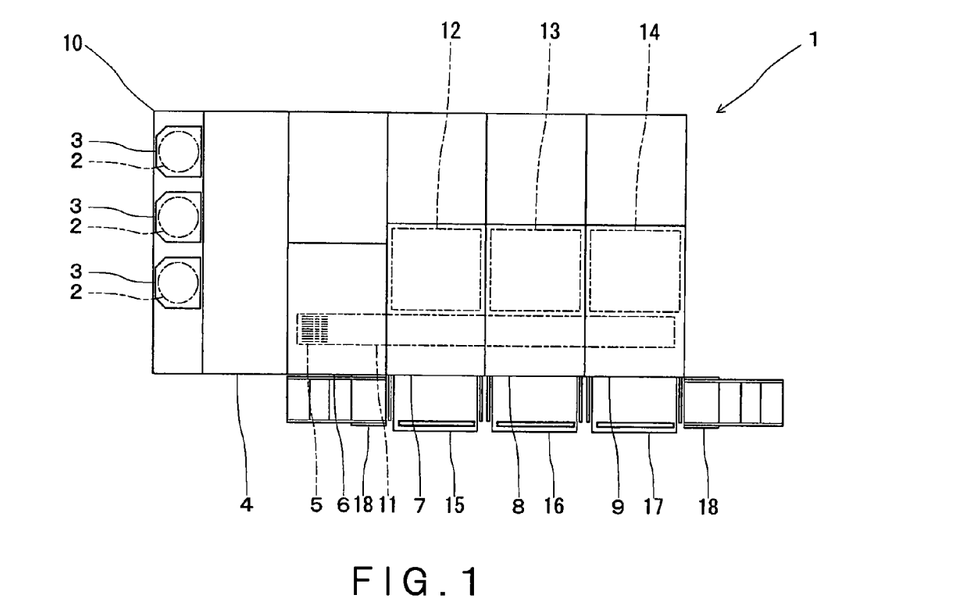
FIG. 1 is a plan view of a semiconductor device fabricating system in one embodiment according to the present invention.
Figure 2:
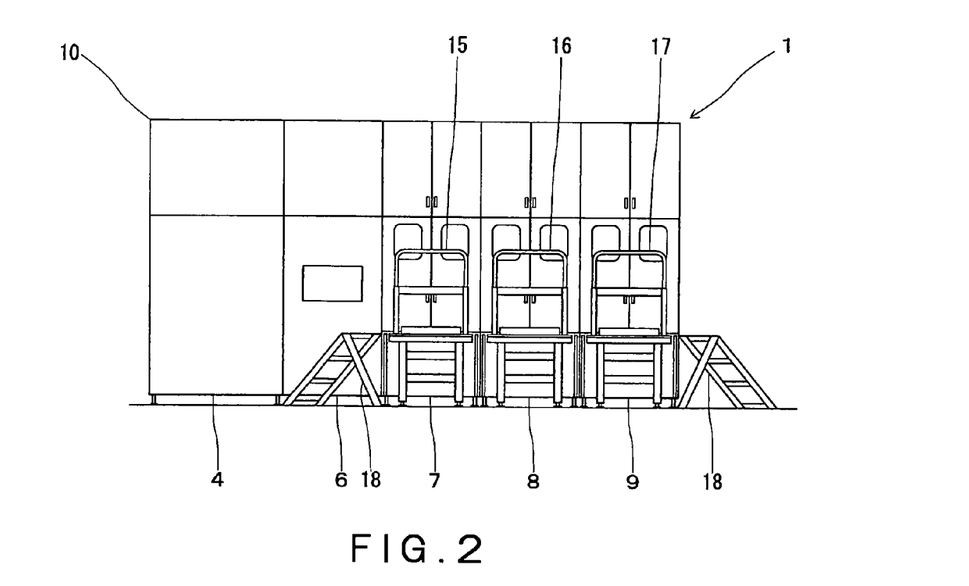
FIG. 2 is a side elevation of the semiconductor device fabricating system shown in FIG. 1.

Referring to FIGS. 1 and 2, a semiconductor device fabricating system 1 includes a box-shaped casing 10. The semiconductor device fabricating system 1 has a carrier handling module 4 for receiving a carrier 3 containing plural wafers 2, namely, substrates, and sending out the carrier 3; a batch organizing module 6 for organizing a batch 5 of wafers 2 to be processed in a batch by combining wafers 2 contained in plural carriers 3, and three types of processing modules 7, 8 and 9 for processing the wafers 2 of the batch 5 by a cleaning process and drying process. The semiconductor device fabricating system 1 includes a casing 10. The casing is dividable into divisions respectively for modules 4, 6, 7, 8 and 9. The semiconductor device fabricating system 1 has a wafer carrying mechanism 11 and processing units 12, 13 and 14. The wafer carrying mechanism 11 and the processing modules 12, 13 and 14 are installed in the casing 10. The carrying mechanism 11 extends from the batch organizing module 6 along the processing modules 7, 8 and 9. The processing units 12, 13 and 14 process the batch 5 of wafers 2 carried thereto by the carrying mechanism 11.

The semiconductor device fabricating system 1 processes the wafers 2 by the following processes. The carriers (FOUP) 3 are delivered to the carrier handling module 4 and are transferred to the batch organizing module 6. The batch organizing module 6 combines the wafers 2 so as to organize the batch 5 to be processed by the processing modules 7, 8 and 9 in a batch processing mode. The carrying mechanism 11 carries the batch 5 to the processing modules 7, 8 and 9. Then, the respective processing units 12, 13 and 14 of the processing modules 7, 8 and 9 process the batch 5 of wafers 2 in a batch processing mode. The carrying mechanism 11 carries the batch 5 of the wafers 2, which have been processed, to the batch organizing module 6. The batch organizing module 6 puts the wafers 2 of the batch 5 into the carriers 3. The carriers 3 containing the wafers 2 are carried to the carrier handling module and are sent out from the carrier handling module 4.

As shown in FIGS. 1 and 2, the processing modules 7, 8 and 9 of the semiconductor device fabricating system 1 are provided with platforms (footboard apparatuses) 15, 16 and 17, respectively. The platforms 15, 16 and 17 can be set outside the casing 10. Indicated at 18 in FIGS. 1 and 2 are step ladders. The platforms 15, 16 and 17 respectively combined with the processing modules 7, 8 and 9 can be individually foldable and can be individually stored in the casing 10. The platforms 15, 16 and 17 are substantially identical and hence only the platform 15 combined with the processing module 7 will be described by way of example.

Figure 3:
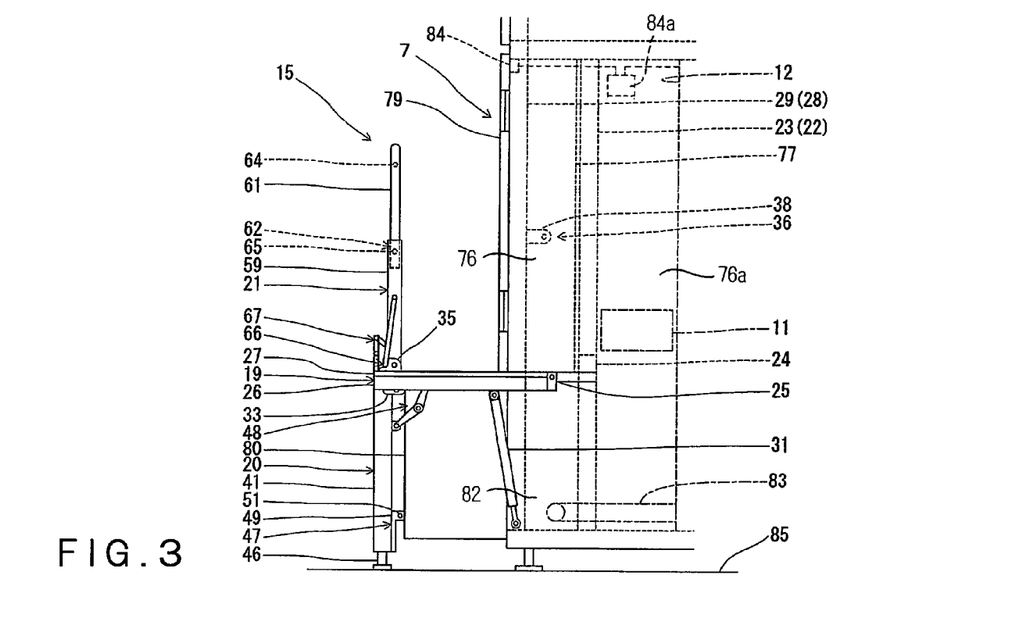
FIG. 3 is a side elevation of the semiconductor device fabricating system shown in FIG. 1, in which platform is set in a working state.
Figure 4:
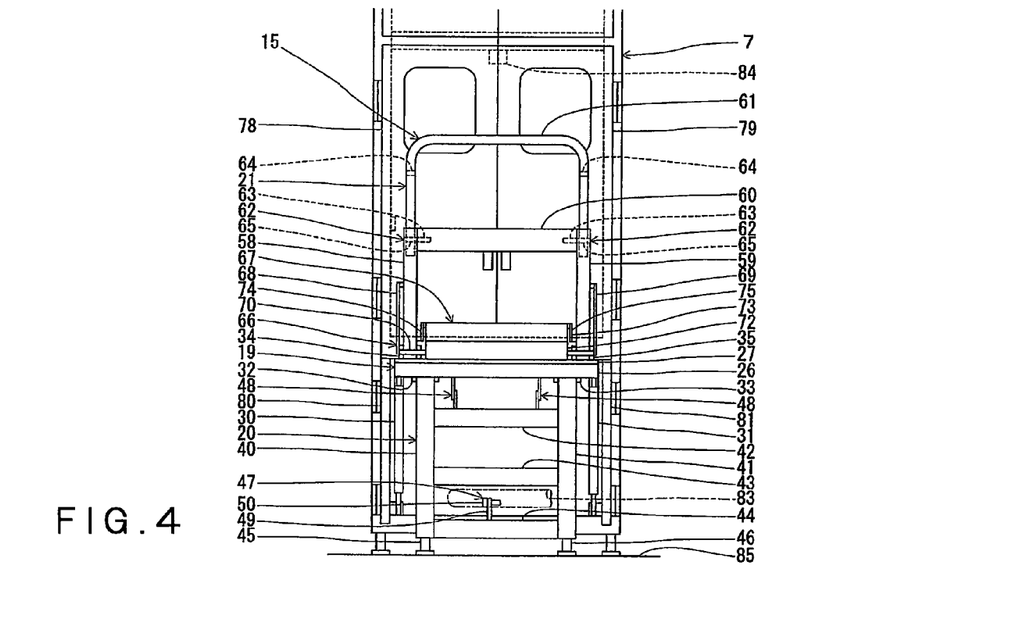
FIG. 4 is a front view of the semiconductor device fabricating system shown in FIG. 1, in which the platform is set in a working state.
Figure 5:
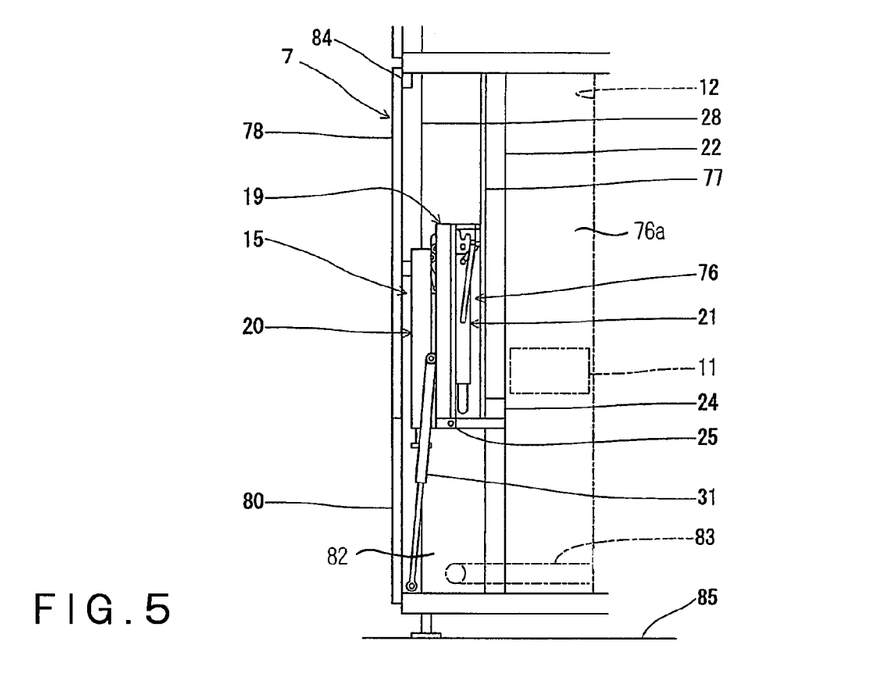
FIG. 5 is a side elevation of the folded platform.

Referring to FIGS. 3 and 4, the platform 15 has a top board unit (top board structure) 19, a leg unit (leg structure) 20 and a handrail unit (handrail structure) 21. The casing 10 has:, for each of the processing modules 7, 8 and 9, right and left outer frames 29 and 28 extending in vertical directions; and right and left inner frames 22 and 23 extending in vertical directions and disposed on the inner side of the right and left outer frames 29 and 28, respectively. The right and left inner frames 22 and 23 are interconnected by a support frame 24 at a middle position in a vertical direction. As shown in FIG. 3, the top board unit 19 of the platform 15 has an inner side extending near the casing 10, and the inner side of the top board unit 19 is connected to the support frame 24 by hinges 25 so as to be turnable on the hinges 25. The top board unit 19 can be turned through an angle of about 90° between a horizontal position where the top board unit 19 extends perpendicularly to a vertical side wall of the casing 10 as shown in FIG. 3 and a vertical position where the top board unit 19 extends substantially parallel to the vertical side wall of the casing 10 as shown in FIG. 5. In the following description, a position of the top board unit 19 shown in FIG. 3 will be referred to as a horizontal position, and the position of the same shown in FIG. 5 will be referred to as a vertical position.

The top board unit 19 has a support frame 26 having an inner side member to which the hinges 25 are attached, and a rectangular top board 27 on top of the support frame 26 in a state where the support frame 26 is in the horizontal position. Two dampers 30 and 31 are extended between a middle part of a right end member of the support frame 26 and a lower end part of the right outer frame 29 of the processing module 7 and between a middle part of a left end member of the support frame 26 and a lower end part of the left outer frame 28 of the processing module 7, respectively.

The top board unit 19 is provided with a right bracket 33 and a left bracket 32 attached to the support frame 26. The brackets 33 and 32 are attached to lower, outer parts, in a state where the top board unit 19 is in a horizontal position, of the right and left end members of the support frame 26, respectively. The leg unit 20 of the platform 15 is connected to the brackets 32 and 33 so as to be turnable on the brackets 32 and 33. The leg unit 20 can be turned through an angle of about 90° between a working position where the leg unit 20 extends perpendicularly to the top board unit 19 as shown in FIG. 3 and a folded position where the leg unit 20 extends substantially parallel to the top board unit 19 as shown in FIG. 5. A right bracket 35 and a left bracket 34 are attached to the right end and the left end member, respectively, of the support frame 26 of the top board unit 19. The brackets 34 and 35 are attached to outer upper parts of the right and left end members of the support frame 26, respectively. Outer upper parts are apart from the side wall of the casing 10, when the top board unit 19 is set in the horizontal position. Lower end parts of the handrail unit 21 of the platform 15 are connected to the top board unit 19 by the brackets 34 and 25 so as to be turnable. The handrail unit 21 can be turned through an angle of about 90° between a position where the handrail unit 21 is substantially perpendicular to the top board unit 19 as shown in FIG. 3 and a position where the handrail unit 21 is substantially parallel to the top board unit 19 as shown in FIG. 5. In the following description, respective positions where the leg unit 20 and the handrail unit 21 extend substantially parallel to the top board unit 19 will be referred to as folded positions and respective positions where the leg unit 20 and the handrail unit 21 extend substantially perpendicular to the top board unit 19 will be referred to as unfolded positions.

Figure 6:
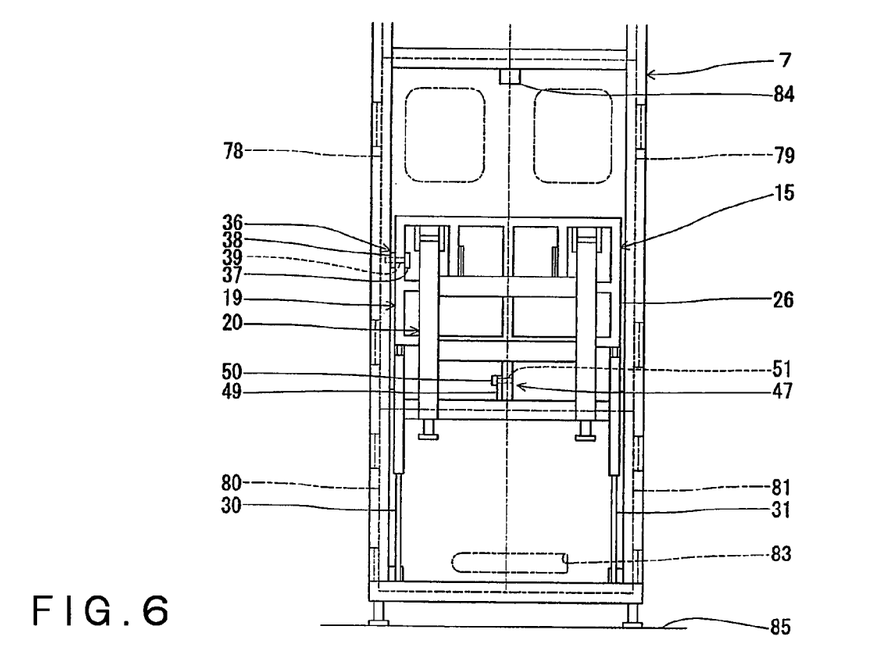
FIG. 6 is a front view of the folded platform.

A locking mechanism 36 is disposed between the top board unit 19 and the left outer frame 28. As shown in FIG. 6, the locking mechanism 36 has a locking pin (locking bar) 37 supported on an outer left part of the support frame 26 so as to be axially slidable, and a support member 38 having a base part fixed to the left outer frame 28. An end part of the support member 38 is provided with a through hole 39 (FIG. 6) into which the locking pin 37 can be inserted. By inserting the locking pin 37 supported on the top board unit 19 into the through hole 39 of the support member 38, it is possible to hold the top board unit 19 in the vertical position as shown in FIGS. 5 and 6. Meanwhile, by pulling the locking pin 37 out of the through hole 39 of the support member 38, it is possible to release the top board unit 19 from locking state in the vertical position.

The leg unit 20 has a right leg member 41 pivotally supported on the right bracket 33 so as to be turnable, a left leg member 40 pivotally supported on the left bracket 32 so as to be turnable, connecting members 42, 43 and 44 extended between the leg members 40 and 41 and spaced apart from each other, an adjustable left foot 45 attached to the free end of the left leg member 40, and an adjustable right foot 46 attached to the free end of the right leg member 41.

A locking mechanism 47 is disposed on the leg unit 20, and stays (position locking mechanisms) 48 are disposed between the top board unit 19 and the leg unit 20.

The locking mechanism 47 has a pin support member 49 attached to a middle part, on the side of the top board unit 19, of the connecting member 44 of the leg unit 20, and a locking pin 50 axially slidably supported on an upper end part of the pin support member 49. As shown in FIG. 6, a through hole 51 into which the locking pin 50 can be inserted is formed in a middle part of the inner side member, extending near the casing 10, of the support frame 26. In a state where the leg unit 20 is folded and superposed on the top board unit 19, the locking pin 50 is inserted into the through hole 51 of the top board unit 19 so as to lock the top board unit 19 and the leg unit 20 together as shown in FIGS. 5 and 6. The locking pin 50 is pulled out of the through hole 51 so as to unlock the top board unit 19 and the leg unit 20.

Figure 13:
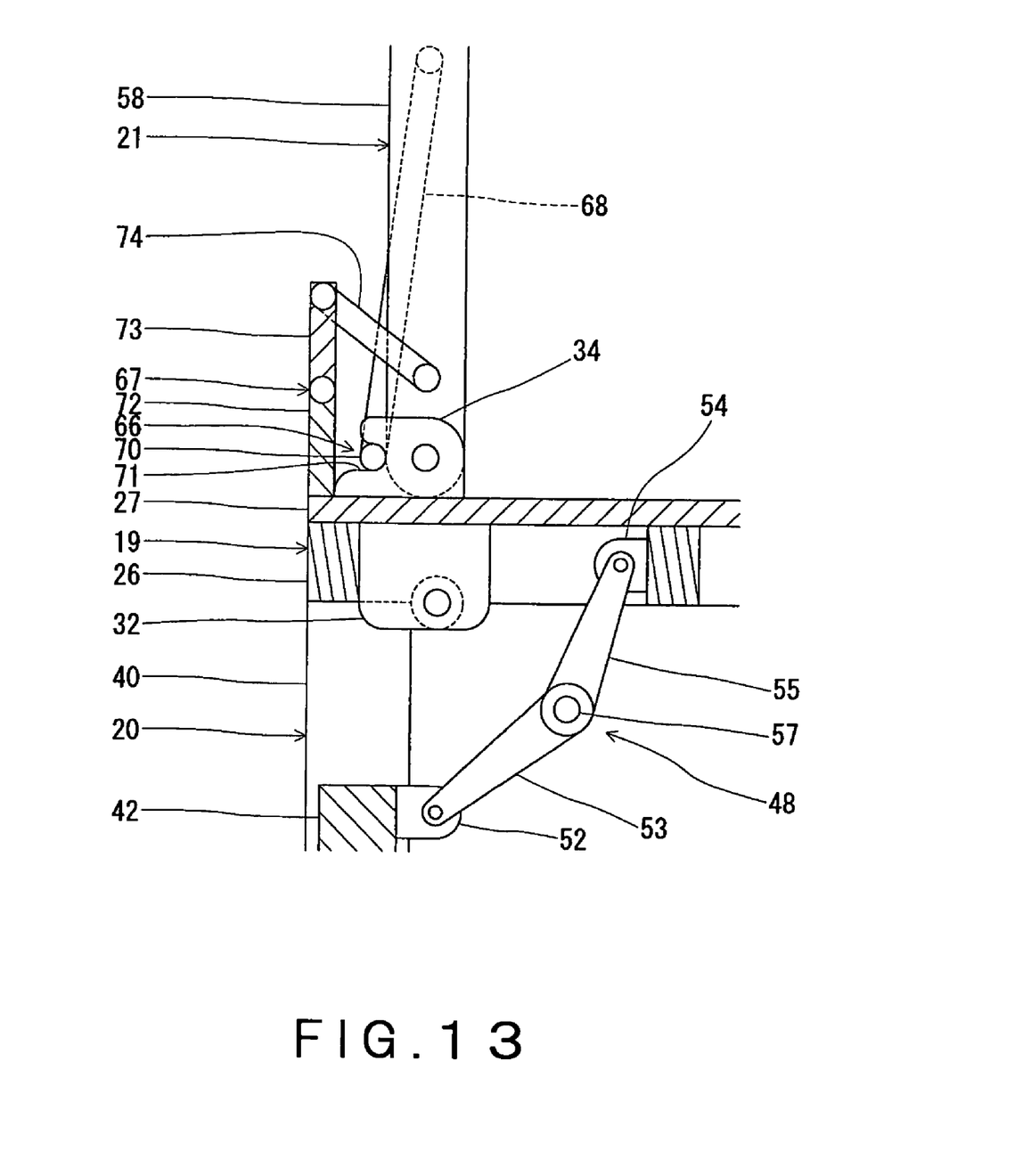
FIG. 13 is a fragmentary, enlarged sectional view of the platform.

Referring to FIG. 13, a bracket 52 attached to an inner part, on the side of the top board unit 19, of the connecting member 42 of the leg unit 20, and a bracket 54 is attached to an outer middle part, not facing the casing 10, of the support frame 26 of the top board unit 19. Each of the stays 48 has a first link 53 having a base part pivotally connected to the bracket 54, and a second link 55 having a base part pivotally connected to the bracket 54. Respective end parts of the links 53 and 55 are pivotally joined together by a pin 57. The stay 48 is unfolded such that the pin 57 moves past a dead point so as to hold the top board unit 19 and the leg unit 20 perpendicularly to each other (FIG. 13). The links 53 and 55 are turned forcedly so as to unfold the stay 48 in a position maintaining state.

The handrail unit 21 will be described. The handrail unit 21 has support members 58 and 59 pivotally connected so as to be turnable to the brackets 34 and 35, respectively, of the top board unit 19, a connecting member 60 extended between the upper ends, apart from the top board unit 19, of the support members 58 and 59, a U-shaped handrail frame 61 slidably connected to the support members 58 and 59, and locking mechanisms 62 disposed between the support member 58 and the handrail frame 61 and between the support member 59 and the handrail frame 61, respectively.

Figure 11:
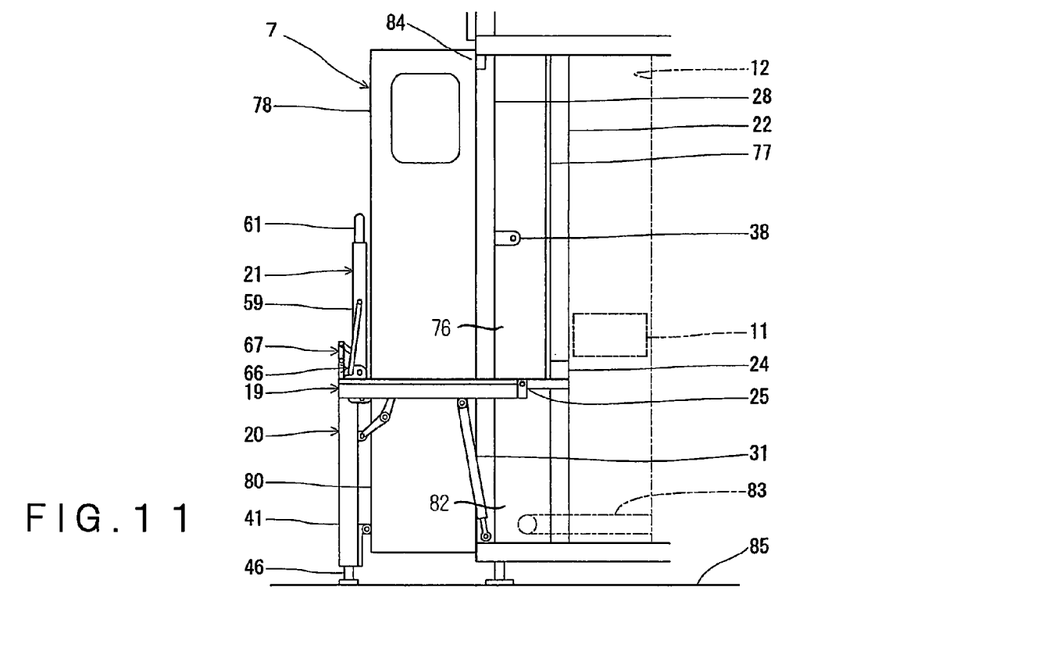
FIG. 11 is a side elevation of the platform, in which a handrail unit has been raised from a position shown in FIG. 9.
Figure 12:
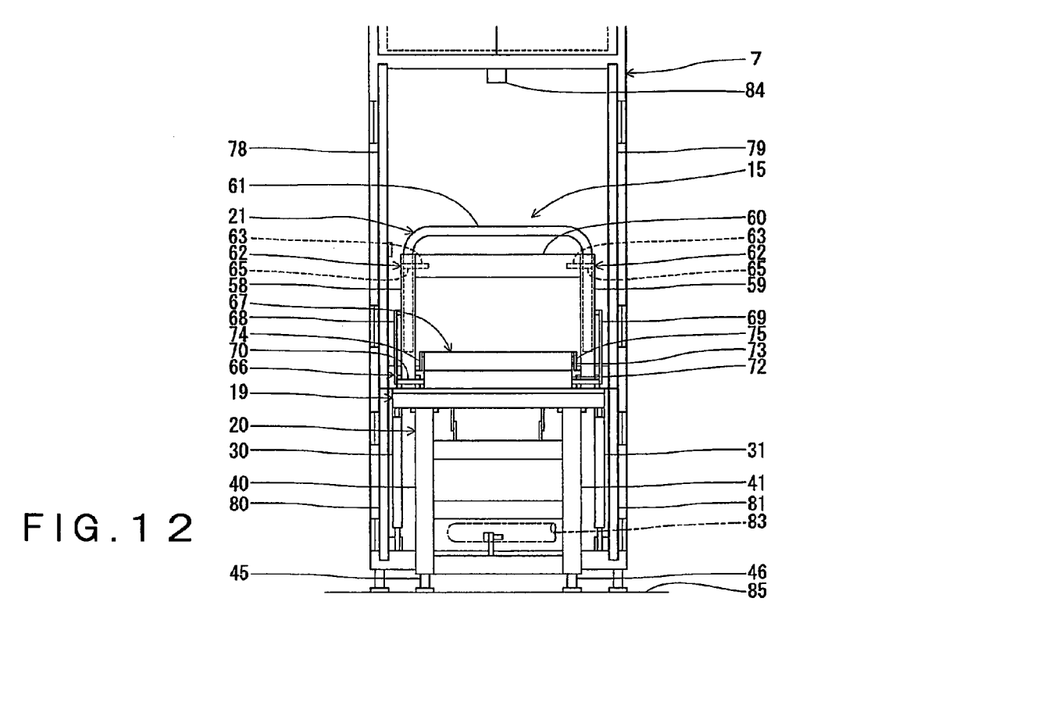
FIG. 12 is a front view of the platform, in which the handrail unit has been raised from a position shown in FIG. 10.

The locking mechanisms 62 have locking pins 63 axially slidably supported on the support members 58 and 59, respectively. As shown in FIG. 4, an upper through hole 64 and a lower through hole 65 for receiving the locking pin 63 are formed in each of legs of the handrail frame 61. The locking pins 63 are inserted into the lower through holes 65 so as to retain the handrail frame 61 at an upper position as shown in FIGS. 3 and 4. The locking pins 63 are inserted into the upper through holes 64 so as to retain the handrail frame 61 at a lower position as shown in FIGS. 11 and 12.

A locking mechanism 66 and a fall preventing mechanism 67 are disposed between the top board unit 19 and the handrail unit 21.

The locking mechanism 66 has turning members 68 and 69 respectively having base end parts pivotally connected to the support members 58 and 59 of the handrail unit 21, respectively, and a locking pin 70 interconnecting free end parts of the turning members 68 and 69. The brackets 34 and 35 of the top board unit 19 are provided with locking grooves 71 in which the locking pin 70 can be fitted. When the handrail unit 21 is set up on the top board unit 19, the locking pin 70 is engaged in the grooves 71 so as to retain the handrail unit 21 in the working position on the top board unit 19 as shown in FIG. 3. The locking pin 70 is disengaged forcibly from the grooves 71 so as to fold the handrail unit 21.

Figure 9:
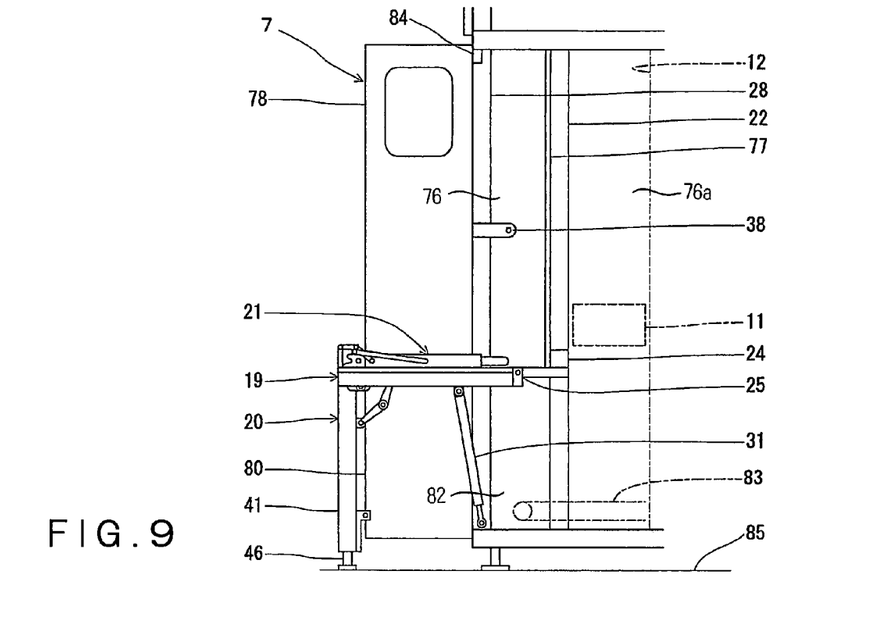
FIG. 9 is a side elevation of the platform, in which a top plate unit has been turned from a position shown in FIG. 7 to a horizontal position.
Figure 10:
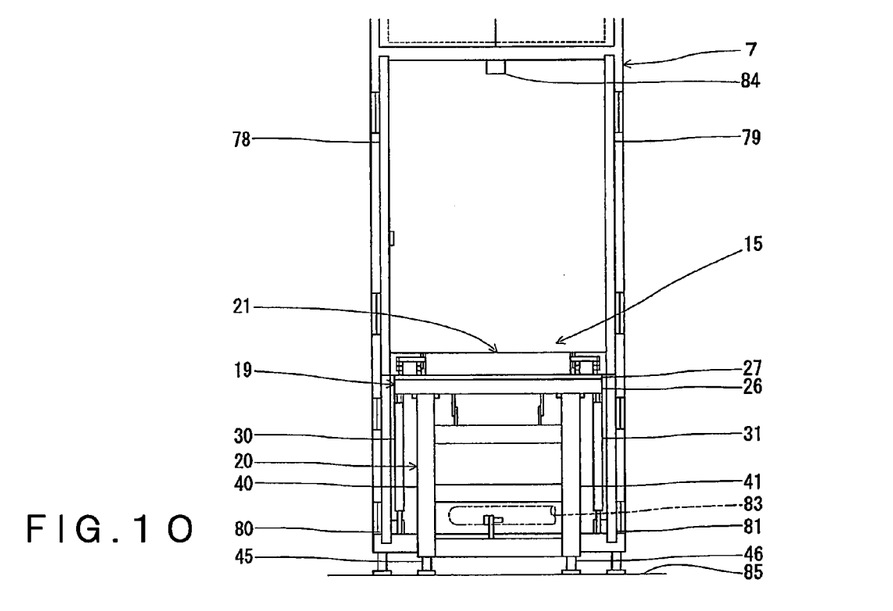
FIG. 10 is a front view of the platform, in which the top plate unit has been turned from a position shown in FIG. 8 to a horizontal position.

As shown in FIG. 13, the fall preventing mechanism 67 has a lower fall preventing wall 72 attached to the outer edge, far from the casing 10, of the top board 27 of the top board unit 19, and an upper fall preventing wall 73 connected so as to be turnable to an end part, apart from the top board 27, of the lower fall preventing wall 72. The lower fall preventing wall 72 has the shape of a laterally long, rectangular plate. The lower fall preventing wall 72 is substantially perpendicular to the surface of the top board 27. The upper fall preventing wall 73 has the shape of a laterally long, rectangular plate. As shown in FIG. 13, respective first end parts of connecting members 75 and 74 are pivotally connected so as to be turnable to upper, right and left end parts, respectively, of the upper fall preventing wall 73. Second end parts of the connecting members 75 and 74 are pivotally connected so as to be turnable to lower inside parts of the support members 59 and 58, respectively, of the handrail unit 21. As the handrail unit 21 is turned on the top board unit 19 so as to stand the handrail unit 21 on the top board unit 19, the upper fall preventing wall 73 stands up as shown in FIGS. 3 and 4. As the handrail unit 21 is turned on the top board unit 19 so as to lay down the handrail unit 21 on the top board unit 19, the upper fall preventing wall 73 lies on the top board unit 19 as shown in FIGS. 9 and 10.

In the platform 15, the inner side, near the casing 10, of the top board unit 19 is connected to the processing module 7 included in the casing 10 so that the top board unit 19 is turnable relative to the casing 10, the upper end of the leg unit 20 are connected to the lower part of the outer side of the top board unit 19 so that the leg unit 20 is turnable relative to the top board unit 19, and the lower end of the handrail unit 21 is connected to the upper part of the outer side of the top board unit 19 so that the handrail unit 21 is turnable relative to the top board unit 19. The platform 15 can be set beside the casing 10 (the processing module 7) as shown in FIGS. 3 and 4 by setting the top board unit 19 in a horizontal position, and setting the leg unit 20 and the handrail unit 21 perpendicularly to the top board unit 19. The platform 15 folded such that the top board unit 19, the leg unit 20 and the handrail unit 21 are superposed can be stored in a storage space 76 formed in the casing 10 (the processing module 7) as shown in FIGS. 5 and 6 by setting the top board unit 19 in a vertical position and folding the leg unit 20 and the handrail unit 21. Although the storage space 76 is formed in the casing 10 (the processing module 7) and the platform 15 folded such that the top board unit 19, the leg unit 20 and the handrail unit 21 are superposed is stored in the storage space 76 in this embodiment, the platform 15 folded such that the top board unit 19, the leg unit 20 and the handrail unit 21 are superposed may be held outside the casing 10 (the processing module 7).

As shown in FIGS. 5 and 6, the wafer carrying mechanism 11 and the processing unit 12 are dispose in a space 76a formed on the inner side of the inner frames 22 and 23 in the processing module 7 storing the platform 15. The storage space 76 in which the platform 15 is stored and the space 76a in which the processing unit 12 is disposed are separated from each other by a partition wall 77. The partition wall 77 is attached to the outer sides of the inner frames 22 and 23. The partition wall 77 is made of, for example, a transparent resin. A right upper door 79 and a left upper door 78 are attached to the outer frames 29 and 28, respectively. A right lower door 81 and a left lower door 80 are disposed under the upper doors 79 and 78 and are attached to the outer frames 29 and 28, respectively. The storage space 76 is defined by lower halves of the upper doors 78 and 79 and a lower half of the partition wall 77.

A pipe of piping 83 connected to the processing unit 12 is extended in a space 82 formed under the storage space 76 in the processing module 7. Lines of wiring connected to the processing unit 12 may be laid in the space 82.

The upper doors 78 and 79 of the processing module 7 can be opened and closed in either of a state where the platform 15 is folded and stored in the storage space 76 and a state where the platform 15 is unfolded and set outside the casing 10. In this embodiment, paths of ends of the upper doors 78 and 79 are above the top board unit 19 in a horizontal position and on the side of the casing 10 with respect to the handrail unit 21 set in a vertical position. A door sensor 84 is disposed on the inner side of the closed upper doors 78 and 79 so as to correspond to upper end parts of the closed doors 78 and 79. It is known from a signal provided by the door sensor 84 whether the upper doors 78 and 79 are open or the upper doors 78 and 79 are closed. The door sensor 84 is connected to a controller 84a shown in FIG. 3 for controlling the processing unit 12. When a signal provided by the door sensor 84 indicates that the doors 78 and 79 are open, the controller 84a sets the processing unit 12 for an unoperatable mode. If a signal provided by the door sensor 87 indicates that the upper doors 78 and 79 are open while the processing unit 12 is in operation for carrying out a process for processing the wafers 2, the process for processing the wafers 2 is interrupted forcibly. When a signal provided by the door sensor 84 indicates that the doors 78 and 79 are closed, the controller 84a sets the processing unit 12 for an operatable mode.

A platform unfolding procedure will be described. The platform unfolding procedure unfolds the folded platform 15 stored inside the casing 10 so as to set the unfolded platform 15 outside the casing 10.

Figure 7:
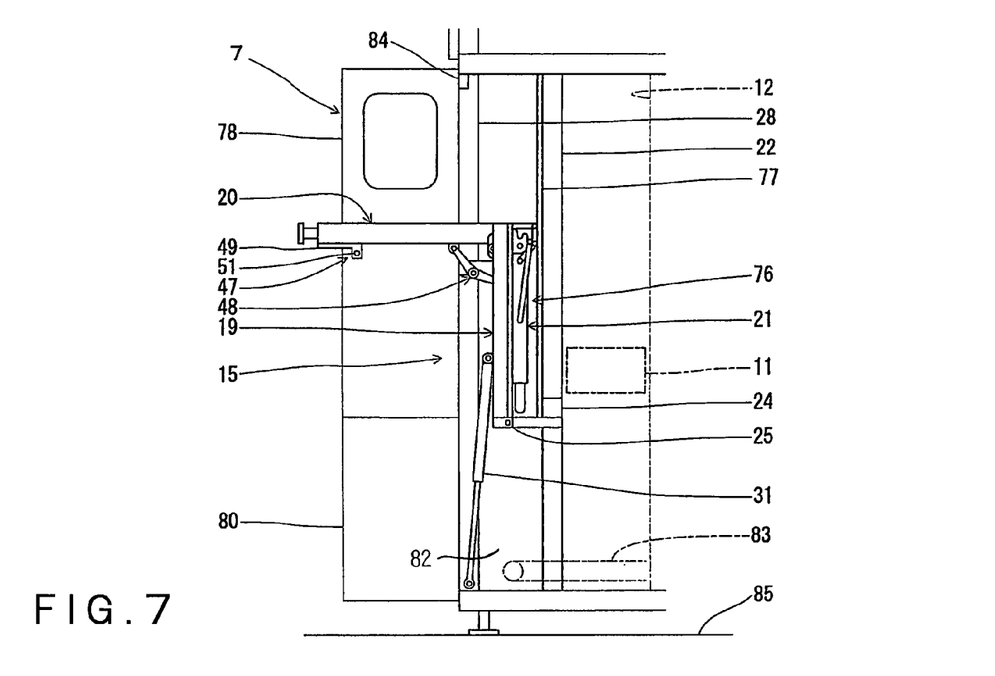
FIG. 7 is a side elevation of the folded platform, in which a leg unit is set in a working position.
Figure 8:
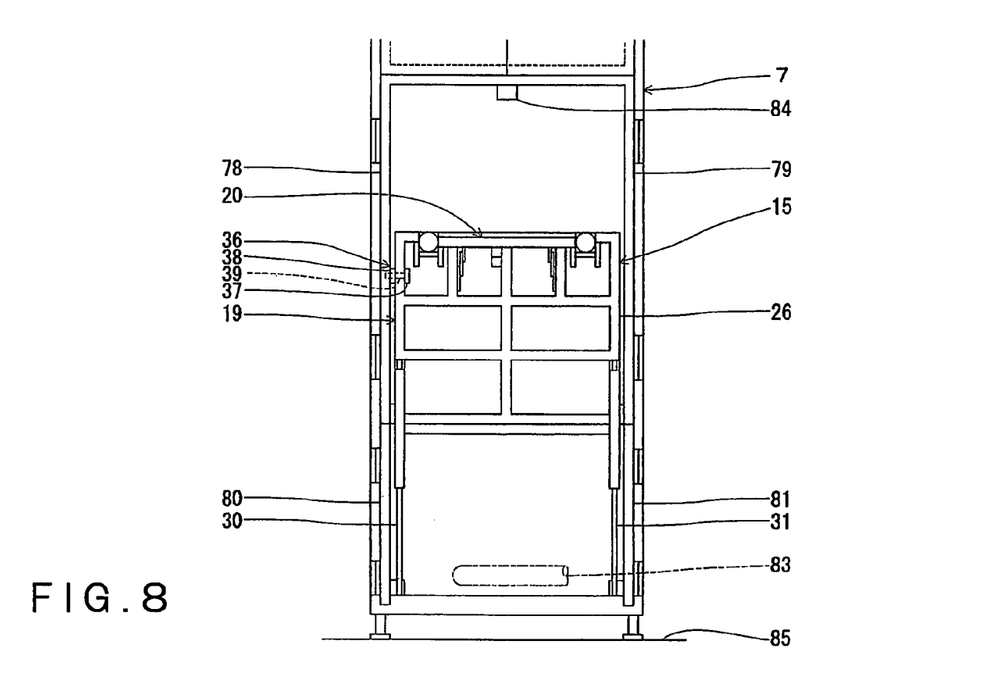
FIG. 8 is a front view of the folded platform, in which the leg unit is set in a working position.

In a state where the folded platform 15 is stored inside the casing 10 as shown in FIGS. 5 and 6, the upper doors 78 and 79 and the lower doors 80 and 81 are opened. Then, the door sensor 84 decides that the upper doors 78 and 79 are opened and the processing operation of the processing unit 12 is stopped forcibly. Then, as shown in FIGS. 7 and 8, the locking mechanism 47 locking the top board unit 19 and the leg unit 20 together is disengaged, the leg unit 20 is turned so as to extend substantially perpendicularly to the top board unit 19, and the stays 48 are set in a working position so as to hold the leg unit 20 in a working position relative to the top board unit 19. Then, as shown in FIGS. 9 and 10, the locking mechanism 36 locking the top board unit 19 to the casing 10 is disengaged so as to release the top board unit 19, and then the top board unit 19 is set in a horizontal position with the leg unit 20 set on the floor 85.

Subsequently, as shown in FIGS. 11 and 12, the handrail unit 21 is set upright on the top board unit 19, and the locking mechanism 66 secures the handrail unit 21 in a working position relative to the top board unit 19. As the handrail unit 21 is raised, the fall preventing mechanism 67 automatically turns to set the fall preventing walls 72 and 73 vertically on the outer edge of the top board unit 19. In the last step of the platform unfolding procedure, the locking mechanisms 62 are disengaged, the handrail frame 62 is pulled up to an elevated position, and then the locking mechanism 62 are engaged so as to hold the handrail frame 61 at the elevated position as shown in FIG. 3. Then, the upper doors 78 and 79 are closed. The door sensor 84 provides a signal indicating that the upper doors 78 and 79 are closed to enable the processing unit 12 to carry out the processing operation.

Thus the platform 15 folded as shown in FIGS. 5 and 6 can be unfolded in an unfolded sate shown in FIGS. 3 and 4. The steps of the unfolding procedure is reversed to fold the unfolded platform 15 shown in FIGS. 3 and 4 and to store the folded platform 15 inside the casing 10.

The semiconductor device fabricating system 1 in the preferred embodiment include the casing 10, and the processing units 12, 13 and 14 for carrying out semiconductor device fabricating processes disposed inside the casing 10 and the platforms 15, 16 and 17 disposed outside the casing 10. Each of the platforms 15, 16 and 17 has the top board unit 19 connected to the casing 10 so as to be turnable between the substantially horizontal position and the substantially vertical position, the leg unit 20 connected to the top board unit 19 so as to be turnable, and the handrail unit 21 connected to the top board unit 19 so as to be turnable. Each of the platforms 15, 16 and 17 can be folded such that the top board unit 19, the leg unit 20 and the handrail unit 21 are superposed. The folded platforms 15, 16 and 17 can be stored in the storage spaces 76 formed inside the casing 10.

According to this embodiment, a space in which the semiconductor device fabricating system 1 is installed and the footprint of the semiconductor device fabricating system 1 can be reduced by folding the platforms 15, 16 and 17. Since the platforms 15, 16 and 17 can be stored in the storage spaces 76, spaces for installing the platforms 15, 16 and 17 can be omitted and hence the footprint of the semiconductor device fabricating system 1 can be further reduced. Especially, since the folded platforms 15, 16 and 17 of the semiconductor device fabricating system 1 are stored in the storage spaces 76, the storage spaces 76 may be small and increase in the footprint of the semiconductor device fabricating system 1 resulting from the formation of the storage spaces 76 can be suppressed.

According to this embodiment, each of the platforms 15, 16 and 17 of the semiconductor device fabricating system 1 has the top board unit 19 having the inner side extending near the casing 10 and connected to the casing 10 so as to be turnable, and capable of being substantially horizontally extended from the casing 10, the leg unit 20 connected to the outer side of the top board unit 19 extending apart from the casing 10 so as to be turnable, and capable of being extended down from the substantially horizontally extended top board unit 19, and the handrail unit 21 connected to the outer side of the top board unit 19 extending apart from the casing 10 so as to be turnable, and capable of being stood upright from the substantially horizontally extended top board unit 19. Each of the platforms 15, 16 and 17 can be folded such that the top board unit 19, the leg unit 20 and the handrail unit 21 are superposed. Thus the footprint of the semiconductor device fabricating system 1 can be reduced still further.

According to this embodiment, each of the platforms 15, 16 and 17 of the semiconductor device fabricating system 1 has the top board unit 19 having the inner side extending near the casing 10 and connected to the casing 10 so as to be turnable, and capable of being substantially horizontally extended from the casing 10, the handrail unit 21 connected to the outer side of the top board unit 19 extending apart from the casing 10 so as to be turnable, and capable of being stood upright from the substantially horizontally extended top board unit 19, and the upper fall preventing wall 73 connected so as to be turnable to the end part of the outer side of the top board unit 19 apart from the casing 10 and capable of rising from the top board unit 19 as the handrail unit 21 is raised. The fall preventing wall 73 prevents fall.

According to this embodiment, the casing 10 is dividable into the processing modules 7, 8 and 9, and the platforms 15, 16 and 17 are combined respectively with the processing modules 7, 8 and 9, and the platforms 15, 16 and 17 are individually set outside the casing 10. Therefore, the platforms 15, 16 and 17 do not need to be designed and manufactured individually, and the semiconductor device fabricating system 1 having constitution meeting user's demands can be built by properly determining the number of processing modules. Since the desired one or one more of the platforms 15, 16 and 17 can be individually set in the working position, the platforms 15, 16 and 17 combined respectively with the modules 7, 8 and 9 can be individually folded or unfolded.

According to this embodiment, the partition wall 77 is disposed in the casing 10 on the side of the platforms 15, 16 and 17 with respect to the processing units 12, 13 and 14; that is to say, the storage spaces 76 for storing the platforms 15, 16 and 17 in the casing 10 and the space 76a in which the processing unit 12, 13 and 14 are installed are separated from each other by the partition wall 77. Therefore, the processing units 12, 13 and 14 can be isolated from an external atmosphere by the partition wall 77 when the platforms 15, 16 and 17 are unfolded in a working position and when the platforms 15, 16 and 17 are folded and stored in the storage spaces 76 to prevent the adverse influence of the external atmosphere on the processing unit 12, 13 and 14. Even if the processing units 12, 13 and 14 produce corrosive gases, the partition wall 77 isolates the platforms 15, 16 and 17 from a corrosive atmosphere created by the processing units 12, 13 and 14 to prevent the corrosion of the platforms 15, 16 and 17.

According to this embodiment, the casing 10 is provided with the upper doors 78 and 79, the spaces 76 for storing the platforms 15, 16 and 17 are covered with the upper doors 78 and 79. The upper doors 78 and 79 can be opened and closed in either of a state where the platforms 15, 16 and 17 are folded and stored in the storage spaces 76 and a state where the platform 15, 16 and 17 are unfolded and set outside the casing 10. Therefore, the upper doors 78 and 79 can be opened to carry out maintenance work in either of a state where the platforms 15, 16 and 17 are folded and stored in the storage spaces 76 and a state where the platform 15, 16 and 17 are unfolded and set outside the casing 10 or the upper doors 78 and 79 can be closed to carry out inspection work and ordinary work.

According to this embodiment, the semiconductor device fabricating system 1 is provided with door sensors 84 that provide a signal indicating the condition of the upper doors 78 and 79. When each of the door sensors 84 provides a signal indicating that the upper doors 78 and 79 are open, the controller 84a connected to the door sensors 84 sets the processing unit provided with the door sensor 84 among the processing units 12, 13 and 14 for an unoperatable mode. When each of the door sensors 84 provides a signal indicating that the upper doors 78 and 79 are closed, the controller 84*a* sets the processing unit provided with the door sensor 84 among the processing units 12, 13 and 14 for an operatable mode. Thus the accidental operation of the processing units 12, 13 and 14 can be prevented while the upper doors 78 and 79 are opened and work for unfolding or folding each of the platforms 15, 16 and 17 is in process. Operations of the processing units 12, 13 and 14 can be started and inspection work or the like can be started when the upper doors 78 and 79 are closed after the work for unfolding or folding the platforms 15, 16 and 17 has been accomplished.

In the semiconductor device fabricating system 1 in the preferred embodiment, the casing 10 is provided with the upper doors 78 and 79, the storage spaces 76 for storing the platforms 15, 16 and 17 are formed behind the upper doors 78 and 79 in the casing 10, and the casing 10 has the spaces 82 formed under the storage spaces 76 formed behind the doors to lay pipes 83 or wiring lines connected to the processing units 12, 13 and 14 therein. Spaces 82 formed under the platforms 15, 16 and 17 can be effectively used for laying the pipes 83 connected to the processing units 12, 13 and 14.

What is claimed is:

1. A semiconductor device fabricating system comprising:
   a casing;
   a processing unit disposed in the casing to fabricate a semiconductor device; and
   a platform disposed outside the casing;
   wherein the platform is foldable,
   wherein the platform includes:
   a top board unit capable of being substantially horizontally extended from the casing, the top board unit having an inner side extending near the casing, the inner side being connected to the casing so as to be turnable;
   a leg unit connected to an outer side of the top board unit apart from the casing so as to be turnable, the leg unit being capable of being extended vertically down from the substantially horizontally extended top board unit; and
   a handrail unit connected to the outer side of the top board unit apart from the casing so as to be turnable, the handrail unit being capable of rising up from the substantially horizontally extended top board unit, and
   the platform is configured to be folded such that the top board unit, the leg unit and the handrail unit are superposed, and
   wherein a storage space for storing the platform is formed in the casing.

2. The semiconductor device fabricating system according to claim 1, wherein
   the platform includes:
   a top board unit capable of being substantially horizontally extended from the casing, the top board unit having an inner side extending near the casing, the inner side being connected to the casing so as to be turnable;
   a handrail unit connected to an outer side of the top board unit apart from the casing so as to be turnable, the handrail unit being capable of rising up from the substantially horizontally extended top board unit; and
   a fall preventing wall set up on the outer side of the top board unit apart from the casing, the fall preventing wall being interlocked with the handrail unit so as to rise up together with the handrail unit.

3. The semiconductor device fabricating system according to claim 1, wherein
   the casing is dividable into divisions respectively for processing modules, and
   platforms combined respectively with the processing modules can be individually set outside the casing.

4. The semiconductor device fabricating system according to claim 3, wherein
   the casing is provided with a partition wall therein on the side of the platform with respect to the processing unit.

5. The semiconductor device fabricating system according to claim 1, wherein
   the casing is provided with a door,
   the storage space for storing the platform formed in the casing is covered with the door, and
   the door is capable of being opened and closed in either of a state where the platform is held in the storage space and a state where the platform is set outside the casing.

6. The semiconductor device fabricating system according to claim 5, wherein
   the casing is provided with a door sensor for sensing an open state and a close state of the door, and
   the processing unit is configured to be set for an unoperatable mode when the sensor corresponding to the processing unit senses the open state of the door, and the processing unit is configured to be set for an operatable mode when the same sensor senses the closed state of the door.

7. The semiconductor device fabricating system according to claim 1, wherein
   the casing is provided with a door,
   a storage space covered with the door for storing the platform is formed in the casing, and
   a space for piping or wiring connected to the processing unit is formed under the storage space for storing the platform.

* * * * *